United States Patent
Hattori

(10) Patent No.: US 10,827,616 B2
(45) Date of Patent: Nov. 3, 2020

(54) MOUNTING STRUCTURE

(71) Applicant: KYOCERA Corporation, Kyoto (JP)

(72) Inventor: Seiji Hattori, San Jose, CA (US)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/262,196

(22) Filed: Jan. 30, 2019

(65) Prior Publication Data

US 2020/0245464 A1   Jul. 30, 2020

(51) Int. Cl.
| | |
|---|---|
| *H01L 23/367* | (2006.01) |
| *H05K 1/18* | (2006.01) |
| *H01L 23/498* | (2006.01) |
| *H05K 1/11* | (2006.01) |

(52) U.S. Cl.
CPC ............ *H05K 1/18* (2013.01); *H01L 23/367* (2013.01); *H01L 23/49827* (2013.01); *H05K 1/119* (2013.01); *H05K 2201/09063* (2013.01); *H05K 2201/09072* (2013.01); *H05K 2201/105* (2013.01); *H05K 2201/1053* (2013.01); *H05K 2201/10393* (2013.01); *H05K 2201/10545* (2013.01); *H05K 2201/10568* (2013.01); *H05K 2201/10598* (2013.01)

(58) Field of Classification Search
CPC ...................... H05K 1/18; H05K 1/119; H05K 2201/10393; H05K 2201/10598; H05K 2201/105; H05K 2201/09063; H05K 2201/10568; H05K 2201/10545; H05K 2201/09072; H05K 2201/1053; H01L 23/367; H01L 23/49827
See application file for complete search history.

(56) References Cited

U.S. PATENT DOCUMENTS

| | | | | |
|---|---|---|---|---|
| 2006/0181857 A1* | 8/2006 | Belady | ............ | H01L 23/467 361/719 |
| 2015/0155876 A1* | 6/2015 | Jayasena | ............ | H03K 19/1776 326/39 |
| 2016/0218094 A1* | 7/2016 | Bruno | ............ | H01L 23/13 |

FOREIGN PATENT DOCUMENTS

JP   4644717 B2   3/2011

* cited by examiner

*Primary Examiner* — Sitaramarao S Yechuri
(74) *Attorney, Agent, or Firm* — Volpe Koenig

(57) ABSTRACT

A mounting structure of the present disclosure includes a package on whose upper surface an electronic component is mounted, a voltage regulator module, a mother board for mounting the package on an upper surface of the mother board, a driver, a plurality of connectors for electrically connecting a conductor layer of the mother board and a conductor layer of the package to each other, and a heat sink.

5 Claims, 2 Drawing Sheets

MOUNTING STRUCTURE

BACKGROUND OF THE INVENTION

1. Technical Field

The present disclosure relates to a mounting structure.

2. Background

As described in Japanese Patent No. 4644717, in a mounting structure in which a semiconductor device, such as a computing element (CPU, GPU, etc.), is mounted on a package substrate, there are an ongoing reduction in the operating voltage of the semiconductor device and an ongoing increase in the power consumption of the semiconductor device. For example, in order to stably operate the computing element having such a low voltage and such a high electric power, a low voltage having small voltage variations needs to be supplied at a high current to the computing element via a board and the package.

SUMMARY

A mounting structure of the present disclosure includes a package on whose upper surface an electronic component is mounted; a voltage regulator module mounted on a facing position on a lower surface of the package, the facing position being where the voltage regulator module faces the electronic component; a mother board for mounting the package on an upper surface of the mother board; a driver mounted on a facing position on a lower surface of the mother board, the facing position being where the driver faces the package; and a plurality of connectors for electrically connecting a conductor layer of the mother board and a conductor layer of the package to each other. The mother board has a through hole for accommodating the voltage regulator module therein and a through hole for passing one or some of the connectors from the upper surface to the lower surface of the mother board. An end portion of the one of the connectors passing through the through hole or an end portion of each of the some of the connectors passing through the through hole is connected near the driver and another end portion of the one of the connectors passing through the through hole or another end portion of each of the some of the connectors passing through the through hole is connected near the voltage regulator module. A heat sink is connected to the voltage regulator module via the through hole for accommodating the voltage regulator module therein.

DETAILED DESCRIPTION

In order to supply at a high current a low voltage having small voltage variations to an electronic component, such as a computing element, a voltage regulator module (VRM) is sometimes used. When a VRM is used, in order to suppress a voltage reduction or an electric power loss, it is better for an electric current path between the electronic component and the VRM to be short. Similarly, it is also better for an electric current path between a driver and the VRM to be short. However, since the VRM supplies a high electric power to the electronic component, the VRM tends to be heated and become hot when the VRM is operated. Therefore, it is necessary to efficiently dissipate the generated heat to the outside of a mounting structure to prevent the heat from adversely affecting, for example, the electronic component and the driver.

In a mounting structure of the present disclosure, an electronic component and a VRM that are on a package are connected to each other by a relatively short electric current path, and the VRM and a driver are connected to each other by a relatively short electric current path. As a result, the mounting structure of the present disclosure allows the electronic component to be stably operated. Further, in the mounting structure of the present disclosure, a heat sink is connected to the VRM. As a result, heat generated when the VRM is operated can be efficiently dissipated to the outside of the mounting structure, as a result of which, for example, the electronic component and the driver are less likely to be adversely affected by the heat.

Figure 1:
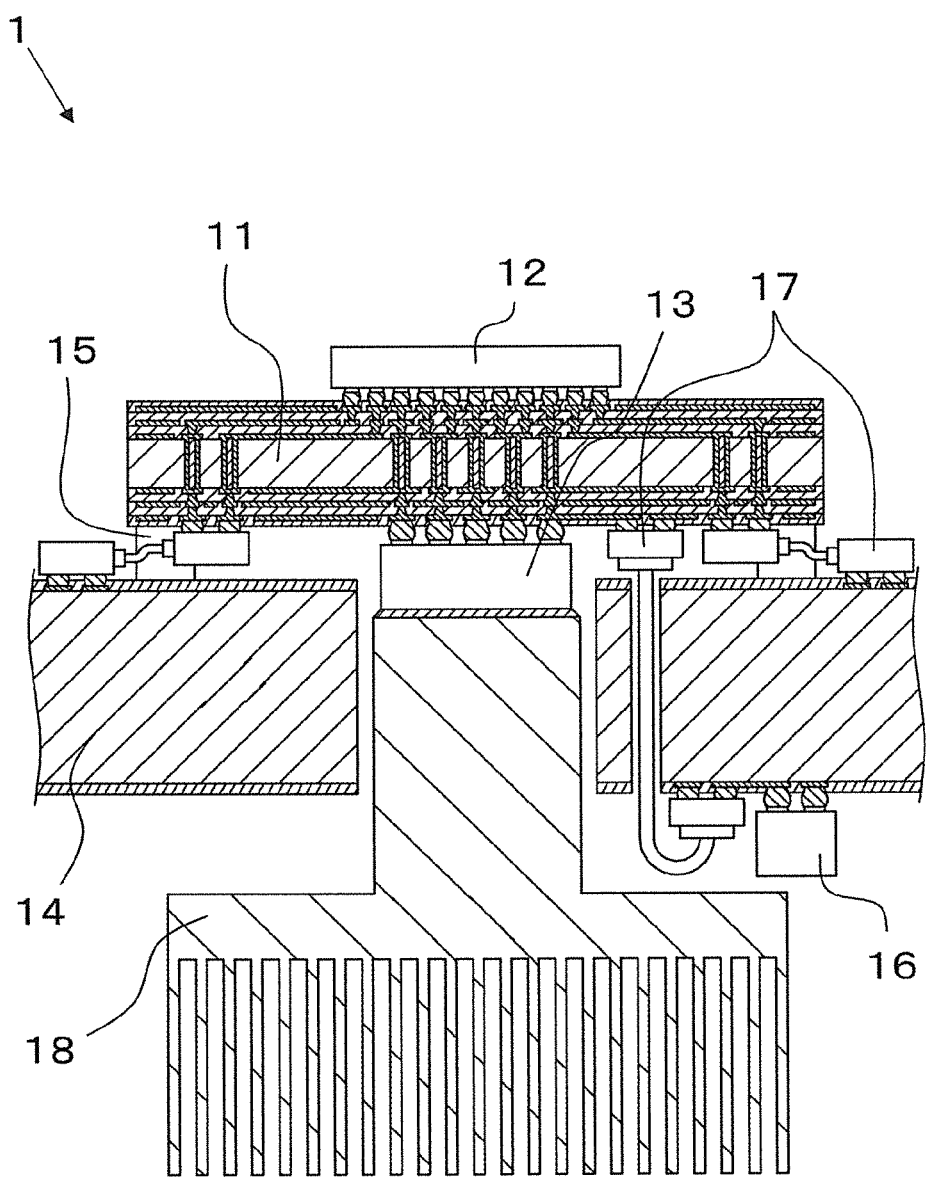
FIG. 1 is a schematic sectional view of a mounting structure according to an embodiment of the present disclosure.

As shown in FIG. 1, in a mounting structure 1 according to an embodiment of the present disclosure, a package 11 is mounted on a mother board 14. The package 11 includes a core layer and insulating layers laminated on both surfaces of the core layer. As long as the core layer is formed of an insulating material, the core layer is not particularly limited to certain core layers. Examples of the insulating material include resins, such as an epoxy resin, a bismaleimide-triazine resin, a polyimide resin, and a polyphenylene ether resin. Two or more types of these resins may be mixed with each other. The core layer may further include, as a reinforcing material, an insulating cloth material, such as a glass fiber, a glass non-woven fabric, an aramid non-woven fabric, an aramid fiber, or a polyester fiber. In the core layer, an inorganic insulating filler, such as silica, barium sulfate, talc, clay, glass, calcium carbonate, or titanium oxide may be dispersed.

In order to electrically connect an upper surface and a lower surface of the core layer, through hole conductors are formed in the core layer. The through hole conductors are formed in through holes extending through the upper surface and the lower surface of the core layer. The through hole conductors are formed by, for example, metal plating, such as copper plating.

The insulating layers are laminated on both surfaces of the core layer. In the package 11 shown in FIG. 1, two insulating layers are laminated on each of both the surfaces of the core layer. Similarly to the core layer, as long as the insulating layers are formed of insulating materials, the insulating layers are not particularly limited to certain insulating layers. The insulating layers may be formed of the same type of resin or different types of resins. The insulating layers and the core layer may be formed of the same type of resin or different types of resins.

Ordinarily, via holes, which are filled with via hole conductors for electrically connecting the insulating layers, are formed in the insulating layers. The via holes are formed by, for example, laser processing, such as $CO_2$ laser processing or UV-YAG laser processing.

Conductor layers are formed on the surfaces of the insulating layers. The conductor layers include wiring conductors, such as wiring conductors for a power supply, wiring conductors for grounding, or wiring conductors for signals, or pads. By performing, for example, a semiadditive method, such conductor layers are formed by depositing an electroless copper plating layer and an electrolytic copper plating layer onto the surfaces of the insulating layers. Alternatively, by using insulating plates on whose surfaces conductors (such as copper foils) are formed, the conductor layers may be formed on the surfaces of the insulating layers by exposure, developing, and etching.

An electronic component 12 is mounted on an upper surface of the package 11. Examples of the electronic component 12 include a computing element (CPU, GPU, etc.), a semiconductor device, and a capacitor. In the mounting structure 1 according to the embodiment, for example, an electronic component 12 having a low operating voltage and a high electric power consumption may be mounted. The operating voltage of such an electronic component 12 may be about 0.65 V to 0.8 V. The electric power consumption of such an electronic component 12 may be about 500 W to 1000 W. In particular, as the electronic component 12, a computing element having an operating voltage of about 0.65 to 0.8 V and a power consumption of about 500 W to 1000 W may be used.

A voltage regulator module (VRM) 13 is mounted on a facing position on a lower surface of the package 11, that is, on a facing position on a surface of the package 11 opposite to the surface of the package 11 on which the electronic component 12 is mounted. The facing position is where the VRM 13 faces the electronic component 12. Here, "facing position" means a position where the electronic component 12 and the VRM 13 face each other and at least partly overlap each other; therefore, "facing position" need not mean a position where the electronic component 12 and the VRM 13 face each other and completely overlap each other. The VRM 13 is used for reducing a high voltage (for example, about 24 V to 48 V) supplied from the mother board 14 to the operating voltage of the electronic component 12 to supply a voltage to the electronic component 12 with small voltage variations.

The package 11 on which the electronic component 12 and the VRM 13 are mounted is fixed to an upper surface of the mother board 14 with an adhesive 15. A driver 16 is mounted on a lower surface of the mother board 14, that is, on a surface of the mother board 14 opposite to the surface of the mother board 14 on which the package 11 is mounted. The driver 16 is used for monitoring, for example, the temperature and the electric current of the VRM 13 and for properly supplying the electric current to the electronic component 12. The driver 16 and the VRM 13 are connected to each other by a relatively short electric current path. Therefore, the driver 16 is mounted on a facing position where the driver 16 faces the package 11. Here, "facing position" means a position where the package 11 and the driver 16 face each other and at least partly overlap each other; therefore, "facing position" need not mean a position where the package 11 and the driver 16 face each other and completely overlap each other.

The conductor layers on the package 11 and conductor layers on the mother board 14 are electrically connected to each other by connectors 17. One or some of the connectors 17 electrically connect the conductor layers on the package 11 on the upper surface of the mother board 14 and the conductor layer on the lower surface of the mother board 14. Therefore, a through hole for passing the one of the connectors 17 or each of the some of the connectors 17 from the upper surface to the lower surface of the mother board 14 is formed in the mother board 14. An end portion of the one of the connectors 17 passing through the through hole or an end portion of each of the some of the connectors 17 passing through the through hole is connected near the driver 16 and the other end portion of the one of the connectors 17 passing through the through hole or the other end portion of each of the some of the connectors 17 passing through the through hole is connected near the VRM 13. When the conductor layers are connected via the through hole in this way, the driver 16 and the VRM 13 are connected to each other by a relatively short electric current path. Further, by passing the one of the connectors 17 or each of the some of the connectors through the through hole, it is possible to reduce the effects of heat that is generated when the VRM 13 is operated.

The VRM 13 on the lower surface of the package 11 is accommodated in a through hole, which is for accommodating the VRM 13 therein, in the mother board 14. The VRM 13 need not be completely accommodated in the through hole. As shown in FIG. 1, at least a part of the VRM 13 may be disposed in the through hole.

In order to dissipate heat that is generated when the VRM 13 is operated to the outside, the mounting structure 1 according to the embodiment includes a heat sink 18. The heat sink 18 is connected to the VRM 13 via the through hole, which is for accommodating the VRM 13 therein, in the mother board 14. Specifically, as shown in FIG. 1, a part of the heat sink 18 is accommodated in the through hole for accommodating the VRM 13 in the mother board 14, and the VRM 13 and the heat sink 18 are connected to each other in the through hole. In this way, when the mother board 14 has a through hole for accommodating the VRM 13 therein, the VRM 13 and the heat sink 18 are easily connected to each other, and heat that is generated when the VRM 13 is operated can be efficiently dissipated to the outside.

The mounting structure of the present disclosure is not limited to the above-described embodiment. For example, in the above-described mounting structure 1, in order to mount the package 11 onto the upper surface of the mother board 14, the adhesive 15 is used. However, the method of mounting the package onto the upper surface of the mother board is not limited thereto.

Figure 2:
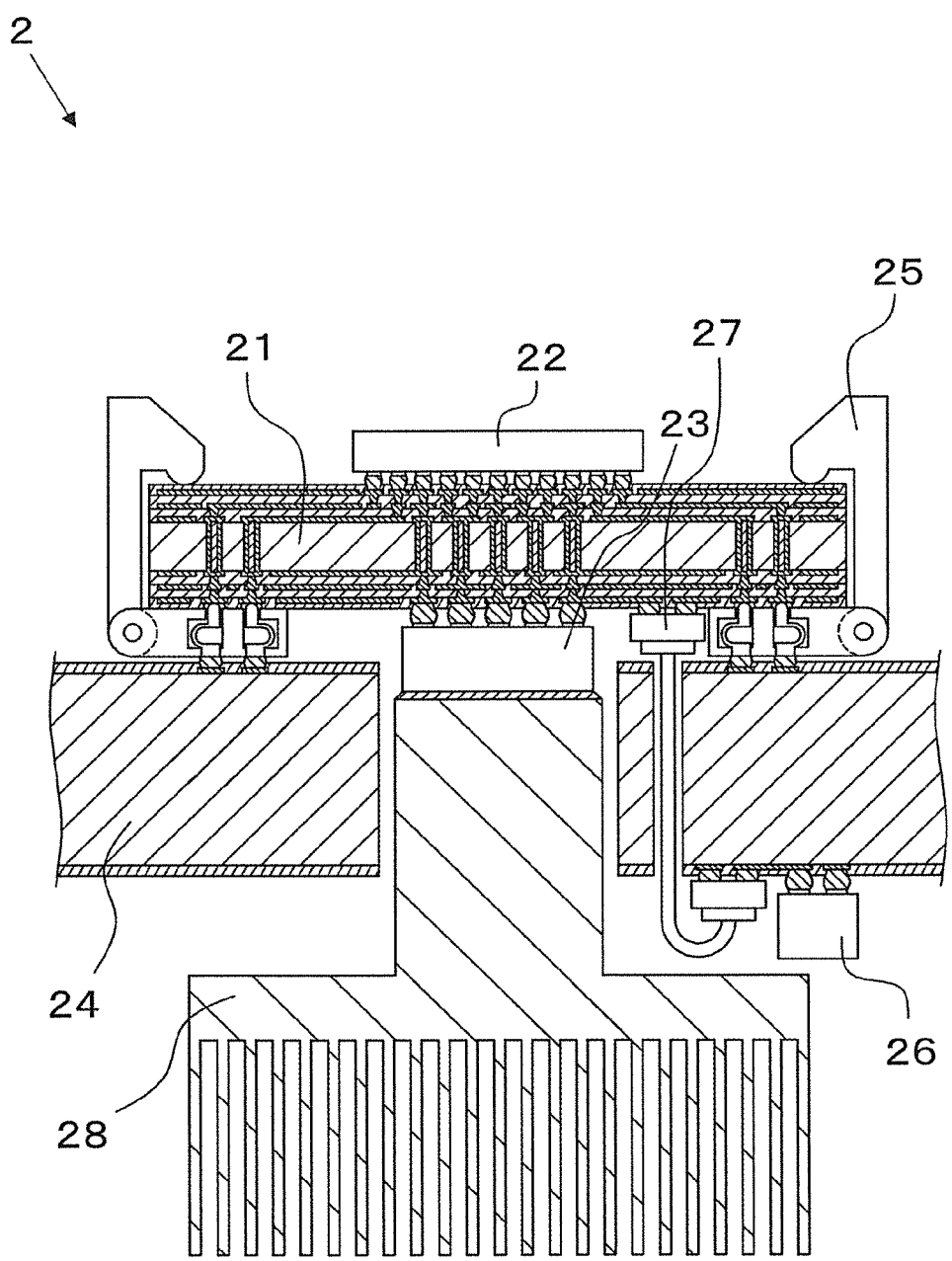
FIG. 2 is a schematic sectional view of a mounting structure according to another embodiment of the present disclosure.

For example, in a mounting structure 2 according to another embodiment shown in FIG. 2, a package 21 on which an electronic component 22 and a VRM 23 are mounted is fixed to an upper surface of a mother board 24 by using an IC socket 25. Specifically, first, the package 21 on which the electronic component 22 and the VRM 23 are mounted is accommodated in the IC socket 25. The IC socket 25 in which the package 21 is accommodated and the mother board 24 are electrically connected to each other. Members other than the IC socket 25 included in the mounting structure 2, that is, the package 21, the electronic component 22, the VRM 23, the mother board 24, a driver 26, connectors 27, and a heat sink 28 are as described above, and are not described in detail.

What is claimed is:

1. A mounting structure comprising:
 a package on whose upper surface an electronic component is mounted;
 a voltage regulator module mounted on a facing position on a lower surface of the package, the facing position being where the voltage regulator module faces the electronic component;
 a mother board for mounting the package on an upper surface of the mother board;
 a driver mounted on a facing position on a lower surface of the mother board, the facing position being where the driver faces the package; and a plurality of connectors for electrically connecting a conductor layer of the mother board and a conductor layer of the package to each other, wherein the mother board comprises a first through hole for accommodating the voltage regulator module therein and a second through hole for passing one or some of the connectors from the upper surface to the lower surface of the mother board, an end portion of the one of the connectors passing through the second through hole or an end portion of the some of the connectors passing the second through hole is connected to the conductor layer on the lower surface of the mother board near the driver and another end portion of the one of the connectors passing through the second through hole or another end portion of each of the some of the connectors passing through the second through hole is connected to the conductor layer on the lower surface of the package near the voltage regulator module, a heat sink is connected to the voltage regulator module via the first through hole for accommodating the voltage regulator module therein, and wherein the diameter of the second through hole is larger than the diameter of the connector, and in the inside of the second through hole, at least a part of the connectors penetrates the second through hole without touching an inner surface of the second through hole.

2. The mounting structure according to claim 1, wherein the package is fixed to the mother board by using an IC socket.

3. The mounting structure according to claim 1, wherein the electronic component is a computing element.

4. The mounting structure according to claim 3, wherein an operating voltage of the computing element is 0.65 V to 0.8 V, and a power consumption of the computing element is 500 W to 1000 W.

5. The mounting structure according to claim 1, wherein a part of the heat sink is located in the through hole and the heat sink and the voltage regulator module are connected in the first through hole.

* * * * *